Figure 1:
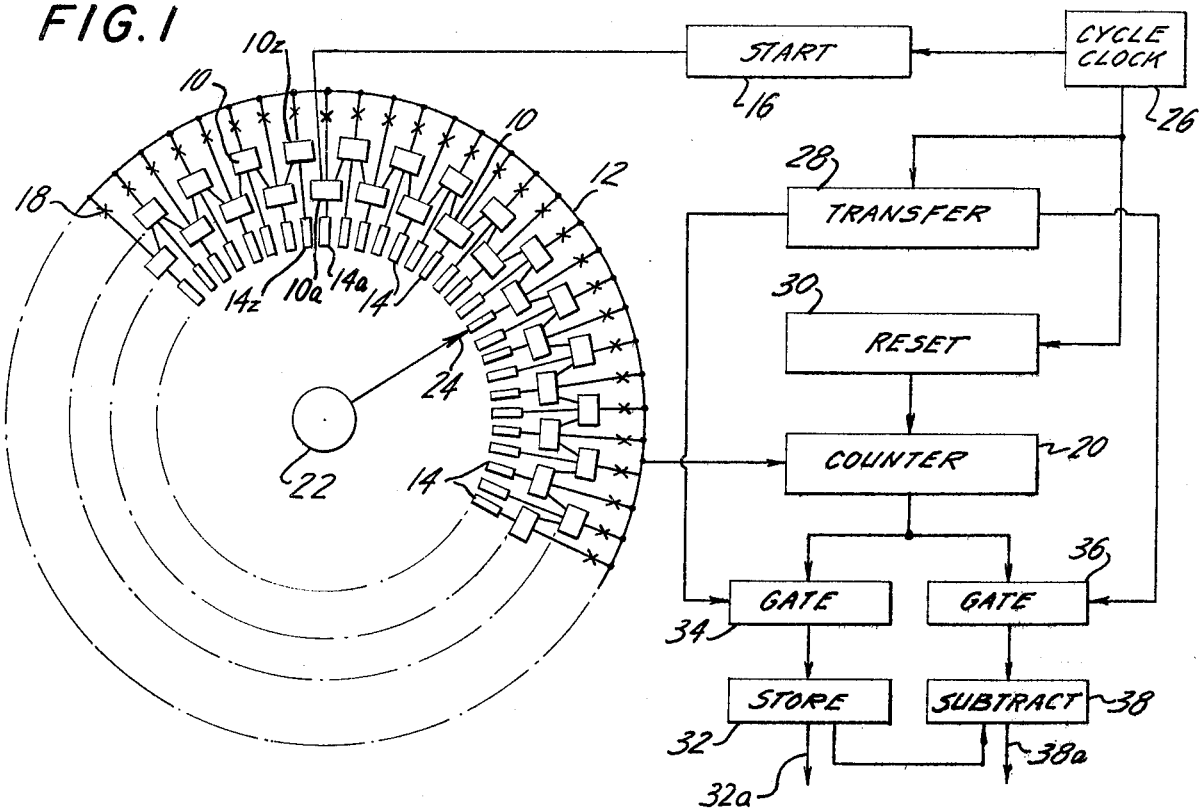

United States Patent [19]

Devol

[11] 4,427,970
[45] Jan. 24, 1984

[54] ENCODING APPARATUS

[75] Inventor: George C. Devol, Wilton, Conn.

[73] Assignee: Unimation, Inc., Danbury, Conn.

[21] Appl. No.: 931,173

[22] Filed: Aug. 4, 1978

Related U.S. Application Data

[63] Continuation of Ser. No. 507,082, Sep. 18, 1974, abandoned.

[51] Int. Cl.³ .............................................. H03K 13/02
[52] U.S. Cl. ................................. 340/347 P; 324/160;
377/44; 377/17; 377/46
[58] Field of Search ..................... 340/347 P, 347 DD;
235/92 PE, 92 FL, 160; 324/161

[56] References Cited

U.S. PATENT DOCUMENTS

| | | | |
|---|---|---|---|
| 2,833,941 | 5/1958 | Rosenberg | 235/92 PE X |
| 2,997,234 | 8/1961 | Hughes | 235/92 PE |
| 3,276,013 | 9/1966 | Chandler | 340/347 DD |
| 3,518,660 | 6/1970 | Nicklas | 340/347 DD |
| 3,666,928 | 5/1972 | Burke | 235/92 PE |
| 3,688,304 | 8/1972 | Rasch | 340/347 P |
| 3,731,301 | 5/1973 | Davis | 340/347 P |
| 3,742,299 | 6/1973 | Gane | 324/161 UX |

Primary Examiner—C. D. Miller
Attorney, Agent, or Firm—Paul S. Martin

[57] ABSTRACT

A sequence of or controls pulse-transfer stages supplies or controls pulses between a start limit and a stop limit in the sequence. The device whose position is to be encoded selects and controls a responsive means in a limiting stage. Each stage has a pulse-control device responsive to the selector or in itself incorporates the selector-responsive pulse-control function, being arranged to serve in different embodiments as a start limit or as a stop limit. In one example, the start limit is the initial stage of the sequence and the selected stage is the stop limit. In an alternative, the selected stage is the start limit and a pulse-transfer stage at or near the end of the sequence is the stop limit. An encoding counter counts pulses between the start and stop limits. The pulse-control devices have a prescribed physical arrangement, which is a circle in the case of a shaft position encoder, so that the counter provides a code that represents the position of a shaft.

Operation of the stages from the starting stage to the last stage is designed to be rapid, compared with motion of the shaft whose position is to be encoded. The disclosed apparatus includes means for measuring the speed of the shaft and evidencing the direction of rotation by comparing successive numerical codes of shaft position.

33 Claims, 4 Drawing Figures

ENCODING APPARATUS

This is a continuation of application Ser. No. 507,082, filed Sept. 18, 1974, now abandoned.

FIELD OF THE INVENTION

This invention relates to apparatus for providing coded representations of position.

BACKGROUND OF THE INVENTION

Electromechanical devices in many different forms have been proposed which provide a coded representation of position, most commonly the angular position of a shaft. In general, such devices incorporate a patterned element and at least as many sensors as there are bits in the code. At least one encoder is known that enters pulses into a counter for representing the angular position of a shaft (Poole, U.S. Pat. No. 2,901,170 issued Aug. 25, 1959) but that device depends upon an elaborate electromechanical structure. The art of shaft-position encoders is highly developed, and yet each known position encoder has its set of limitations, usually entailing complexity, high cost, and unreliability.

SUMMARY OF THE INVENTION

The present invention represents a departure in principle from known position encoders. As will be seen in the illustrative embodiments, plural pulse-transfer stages are equipped with respective pulse-control devices which, in turn, are responsive to and selectively controlled by a selector carried by a physical element, a selector, whose position is to be encoded. Pulse-transfers along the sequence of stages are counted between a reference stage and a stage selected by the physical element, the count in the counter being in the form of a combination code. It may be a binary counter, for example, but if that form of code is not the form of position-representation desired, a code converter can be used. However, a binary numerical code that is here provided directly by an encoder has the advantage over others, in that a code converter is not needed to produce a numerical code used in processing the value represented by the encoder for machine control.

The pulse-transfer stages operate electronically, at a high speed that is entirely independent of a mechanical motion to control counting of pulses by the counter, as by generating position-signifying trains of pulses or controlling the transmission of separately generated pulses. The cycle duration from the first to the last stage can be so short that many encoding cycles per second can be executed. The whole device is amenable to being formed as an integrated circuit. Thus the unit cost of an encoder can be relatively low and the encoder can be quite compact.

The values present in the counter at the start and end of an accurate time interval are utilized, as a further feature of the invention, to represent speed and direction of a shaft or other moving element.

The nature of the invention, including the foregoing and other novel features and advantages, will be better appreciated from the following detailed description of several illustrative embodiments, in which reference is made to the accompanying drawings.

FIGS. 1 through 4 of the drawings are schematic representations of four different embodiments illustrating features of the invention.

Referring now to FIG. 1, a sequence of pulse-transfer stages 10 is shown, from initial stage 10a to final stage 10z. These stages are, for example, monostable multivibrators triggered into their "on" or unstable states for an extremely small time interval by an input pulse. Each such stage 10 produces an output pulse of very short duration to output bus 12 when the stage turns "on", or is activated the pulse lasting until the stage turns "off". Each stage 10 also produces a triggering pulse to the input of the next pulse-transfer stage in the sequence when lapsing into its "off" or stable state. The timing of the triggering pulse and the response of the next stage that is to be triggered "on" is such as to allow a short time interval between the output pulse of each stage 10 to bus 12 and the output pulse of the next stage 10. Consequently stages 10 produce a train of pulses on bus 12.

Each stage 10 has a pulse-control device or element 14, for controlling the operation of its related stage. This may be a metal contact in an example, or it may be a magnetic detector such as a Hall-effect device, or an ionized-discharge detector. Selector 24 (see below) in other examples can take the form of a charged plate of a capacitor, in which case pulse-control device 14 includes a companion capacitor plate; and similarly selector 24 can be an exciting loop for coupling control excitation to a companion loop, perhaps only a single-turn loop. Device 14 would then include such a loop together with an appropriate means for maintaining the related pulse-transfer stage "on" in response to high-frequency excitation from selector 24.

In the preferred embodiment, pulse-control device or element 14 is a photo-diode or a photo-transistor. Indeed, such photo-detector may form part of its respective pulse-transfer stage 10. It is so arranged that, when pulse-control device 14 of FIG. 1 is actuated, it disables its respective stage 10 against responding to an input pulse from the next-preceding stage 10, as by providing sustained bias to maintain stage 10 in its "on" state and in that way to prevent the stage from either responding to an input pulse or to produce an output pulse.

Pulse-control devices 14 are ordinarily distributed in a circular array at uniform intervals from reference stage 10a to stage 10z. Where it is unnecessary to encode more than one rotation of shaft 22, there may be a gap between the devices 14 of stages 10z and 10a. In some cases, as where the code of shaft 10 is combined with that of a slower shaft geared to it, devices 14 of stages 10z and 10a have the same spacing as that of the devices 14 of all the other stages.

"Start" control 16 provides a single brief triggering pulse to the first stage 10a. If none of the pulse-control devices 14 were "actuated", then stages 10 would become triggered in rapid sequence from 10a to 10z. Each stage produces an output pulse to bus 12, the connection to bus 12 optionally including isolation element 18 such as a diode for preventing reverse pulses from bus 12 from affecting any of the other stages 10.

Bus 12 is connected to deliver a train of pulses at the input of counter 20 which, most commonly, is a multistage binary counter. In an example, if there are $2^{13}$ or 8,192 stages 10 in the sequence, binary counter 20 comprises thirteen stages. In any case, the counter provides a combination-code output uniquely representing each one of any possible number of input pulses from bus 12 in one rotation of shaft 22.

Elements 10, 14 and 18 and their connections may all be formed as an integrated, so-called solid-state circuit, which in use is ordinarily fixed in position. The integrated circuit optionally includes counter 20 and other associated circuits. Shaft 22 carries selective control or actuating means or selector 24 such as a narrow-beam light source where pulse-control devices 14 are photoelectric or photo-resistive devices. Actuator 24 is a companion device to actuate device 14 in any case, such as a moving contact where devices 14 are contacts, etc.

Selector 24 spans more than one of the devices 14, preferably two devices 14, where it is important to insure against the possibility of selector 24 being located between two devices 14. In case of a light selector, a light source (not shown) may be arranged to illuminate all devices 14 and a mask having a slit of appropriate width may be disposed opposite devices 14, the mask being carried by shaft 22. When a pulse from "start" control unit 16 starts generation of a train of pulses by transfer stages 10, the train of pulses is interrupted when the first stage is reached having its device 14 illuminated or otherwise actuated by selector 24. Triggering of any pulse transfer stage 10 tests whether its element 14 is in cooperation with selector 24 and, if so, generation of the pulse train is interrupted. Accordingly selector or actuator 24 is a selective control means to which pulse-control devices 14 are responsive. The pulses produced enter counter 20, whose combination-code output represents the position of shaft 22.

It is not essential for selector 24 to be confined to a single device 14. The effect of selector 24 on the sequence of stages 10 is realized with respect to the first stage 10 that is affected. Some slight ambiguity might occur, as when the devices 14a and 14z of two stages 10a and 10z are affected; but such ambiguity may be acceptable in some applications of the encoder or, if not, suitable refinements can be introduced. Where devices 14 of stages 10a and 10z are spaced far apart, there is no such problem for stage 10z.

A cycle clock 26 provides coordinating pulses for operating "start" control unit 16, transfer-pulse unit 28 and reset-pulse unit 30. The count in counter 20 is transferred to temporary store 32 via gate 34, and then reset unit 30 returns counter 20 to zero. After any desired time interval, "start" control unit 16 is again activated for initiating stages 10 in operation for producing a new representation in counter 20, to show where selector 24 is positioned relative to pulse-control devices 14. In this example, cycle clock 26, gate 34, transfer unit 26, reset unit 30 and temporary storage unit 32 are shown as being part of the illustrative encoding apparatus, but of course all of these devices could be part of the external equipment with which the encoder is to be used.

To special advantage, cycle clock 26 has a short but definite time cycle longer than the total time interval required for pulses to be transferred all the way from stage 10a to stage 10z. By adding a gate 36 and a subtraction device 38, it becomes possible to subtract the value in counter 20 from the value in store 32 that was entered during the preceding cycle of cycle clock 26. The count difference is the output of subtractor 38, available at terminal(s) 38a, provides a measure of the speed of shaft 22. The numerical difference representing the angular displacement that occurred during the consistent time interval of cycle clock 26 represents speed. This may be converted to an analog value, if desired, and it may be stored as in a capacitor. The sign of the subtracted result represents the direction of rotation. After transfer of the count to storage unit 32, the combination code provided by the counter becomes available at terminal(s) 32a.

Depending on the number of stages 10 and the circuit design, and particularly in the case of an integrated-circuit device 10 12, 14, 18, the entire pulse sequence from 10a to 10z may require a time interval of ten microseconds or less. The time interval of cycle clock 26 is then made slightly longer than 10 microseconds.

Figure 2:
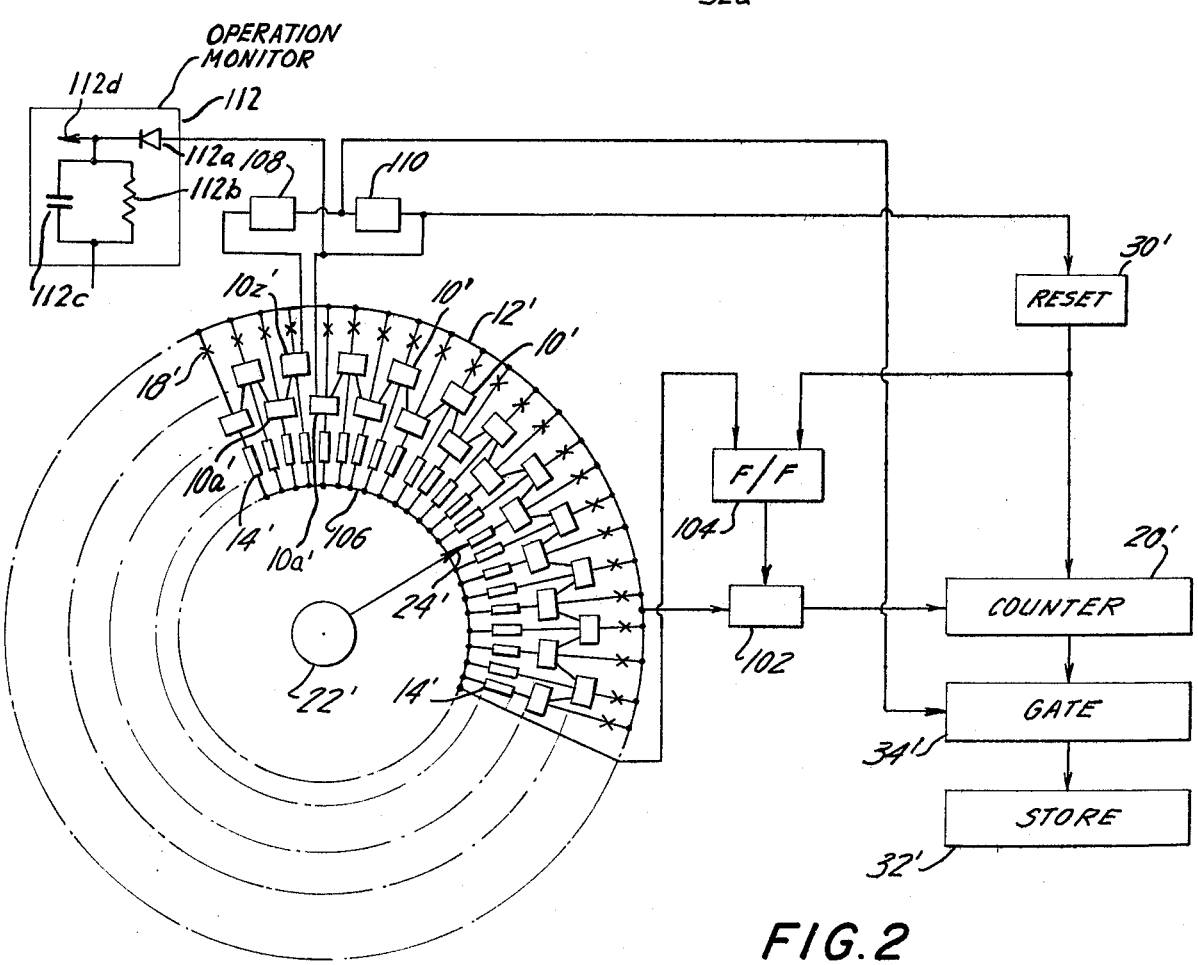
Figure 3:
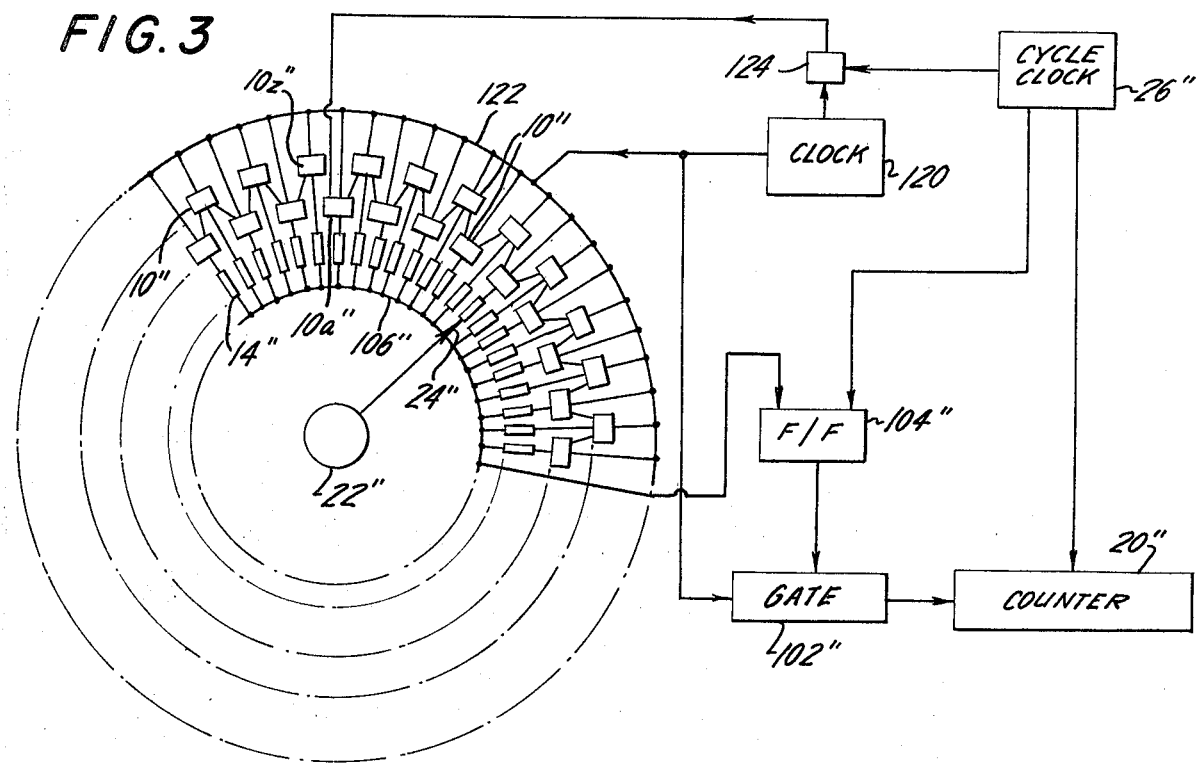

FIG. 2 shows a modification in that (unlike the embodiment of FIG. 1) the selector for the pulse-control devices does not interrupt the continued transfer of pulses from stage to stage all along the sequence of stages illustrated.

In FIG. 2, primed numbers are used to designate parts corresponding to like parts in FIG. 1, and the description of FIG. 1 in large measure applies to FIG. 2. it will be noted that stage 10z of FIG. 1 does not emit a triggering pulse to another stage, and it will be recalled that each pulse-control device or element 14 which is responsive to selector 24 maintains its related pulse-transfer stage 10 in a disabled state, non-responsive to input pulses. Further, in FIG. 1, pulses from stage 10 to succeeding stages simply stop when the transfer of pulses from stage to stage is halted at selector 24. Such interruption of pulse transmission is not a basic limitation of the presently contemplated encoders.

In FIG. 2, once a triggering pulse is applied to stage 10a', the sequence of stages produce triggering pulses to cause successive triggering of all of the stages from stage 10a' to stage 10z'. Pulses from bus 12' reach counter 20' via gate 102. Before a triggering pulse reaches initial or reference stage 10a', a reset pulse from unit 30' resets flip-flop 104, that controls gate 102, just as the counter is reset. When flip-flop 104 is reset, gate 102 is conditioned to pass pulses to counter 20' from bus 12'.

The circuit of each stage 10' in FIG. 2 is such that it is not controlled by its related pulse-control device or element 14', and therefore as many pulses appear on bus 12' in response to an initial triggering pulse to stage 10a' as there are stages in the sequence. Devices 14' in FIG. 2 become selectively enabled by selector 24' to transmit pulses from any stage 10' to bus 106. Each stage thus tests its control element 14' as to whether selector 24' has activated the control element 14' of that stage. For example, devices 14' may be photodiodes that normally do not conduct and selector 24' is then a light source that selectively renders devices 14' conductive. Other suitable devices may replace the photodiodes, as indicated above. So long as devices 14' are not exposed to actuator 24', bus 106 remains passive. When a pulse-transfer stage 10' is turned "on", if its device 14' is exposed to selector 24', a setting pulse is transmitted from stage 10' via device 14' and bus 106 to flip-flop 104. The latter becomes set and thereafter blocks subsequent transmission of pulses from bus 12' to counter 20'. Pulse-shift stages 10' continue to apply pulses to bus 12' until stage 10z' is triggered, but those pulses are blocked by gate 102.

If desired, the sequence of pulse-transfer stages 10' can be utilized as a cycle clock, to replace "start" control unit 16 and cycle clock 26 of FIG. 1. If this is desired, two more pulse-transfer stages 108 and 110 can be interposed between stages 10z' and 10a'. Stage 108 produces a pulse that actuates gate 34' to transfer the value in counter 20' to store 32'. Thereafter stage 110 activates reset pulse generator 30', and indeed stage 110 could be used as the reset pulse source. An operation monitor 112, activated by a steady sequence of pulses as from stage 110 can be included. A charge builds up on capacitor 112c via rectifier 112a, but the voltage at terminal 112d fades by virtue of discharge resistor 112b in case the circulation of pulses is interrupted.

It should be understood that, in lieu of stages 108 and 110, the circuit of FIG. 2 can utilize a cycle clock as in FIG. 1. Additionally, elements corresponding to a second gate 36 and subtractor 38 of FIG. 1 are implicitly part of the embodiment of FIG. 2. Furthermore, if desired, the pulse-transfer stages in the circuit of FIG. 2 can be of a type to be caused to advance by a clock-pulse generator, like the action that is present in usual circulating shift registers. In that event (FIG. 3) the pulse-transfer stages 10" step an input pulse along, stage by stage, so as to act as a commutator for successively testing devices or elements 14" for their response to selector or selector 24". In that case the system is not dependent on stages 10" to generate pulses on bus 12' as in FIG. 2 because such pulses are available from the clock-pulse generator 120 for input to gate 102" and counter 20". Instead, pulses from clock-pulse generator 120 are applied to bus 122 to advance an input pulse from reference stage 10a" to stages 10" in succession; and the clock pulses are also applied to gate 102". Cycle clock 26" in FIG. 3 produces an input pulse via gate 124 to initial stage 10a" of the sequence and, a moment earlier, cycle clock 26" resets counter 20" and flip-flop 104" which is then in condition to cause gate 102" to pass input pulses to counter 20". As in FIG. 2, selector or selector 24" enables a selected pulse control device 14" that responds to selector 24 to pass a pulse from the related stage 10" to bus 106" and to the "set" input of flip-flop 104" for terminating the count.

Figure 4:
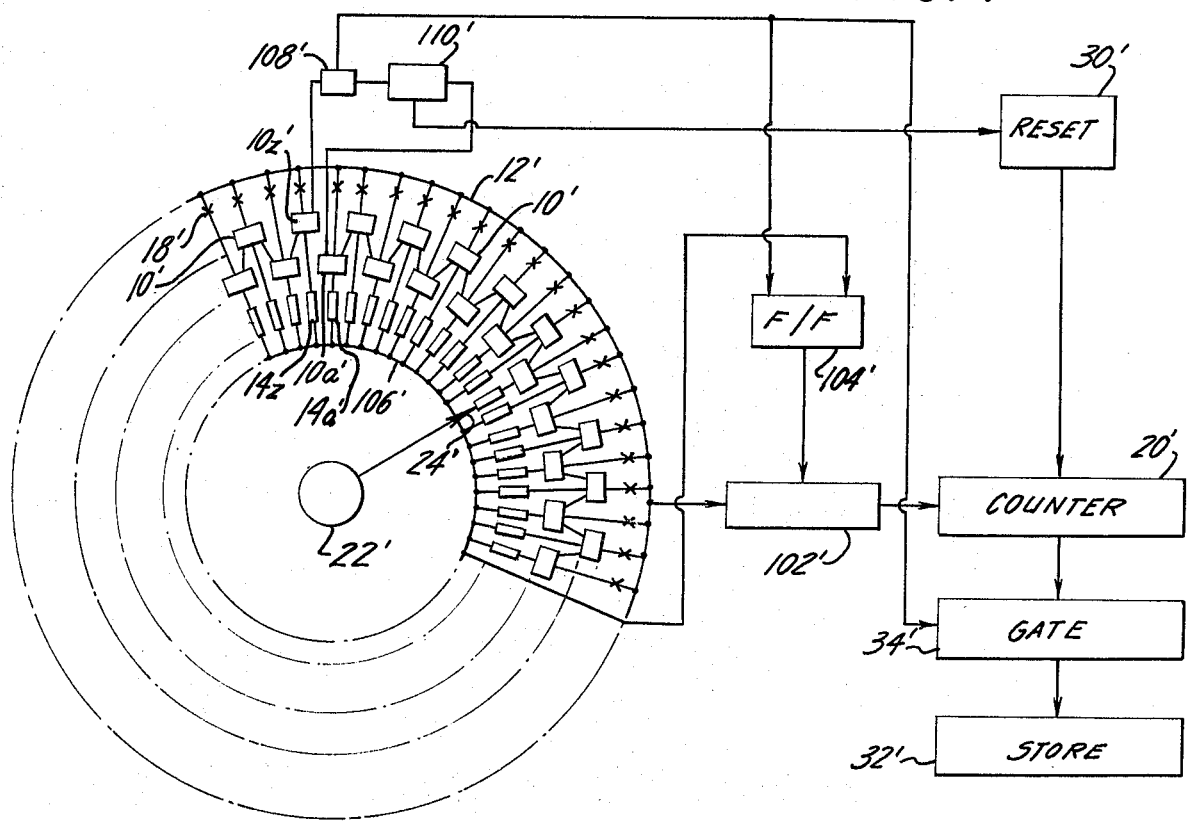

In another embodiment shown in FIG. 4, being a modification of FIG. 2, the signal for resetting flip-flop 104' is taken from bus 106'. In doing so, the setting signal for flip-flop 104' is taken from stage 108'. The same numerals in FIG. 4 are used as in FIG. 2, except that numerals 102' through 110' replace numerals 102 through 110.

The starting pulse to initial pulse-shift stage 10a' comes from stage 110' in FIG. 4. When pulses advance to the first stage 10' where pulse-control device 14' is exposed to, and responds to, selector or selector 24', that stage impresses a pulse on bus 106'. This pulse resets flip-flop 104'. Stages 10' continue to deliver pulses to bus 12'. These pulses enter counter 20' since flip-flop 104' is reset and has enabled gate 102' to pass pulses from bus 12' to counter 20'. These pulses continue, until final or reference pulse-shift stage 10z' has delivered a trigger pulse to pulse-transfer stage 108'. This action sets flip-flop 104' and disables gate 102'. Thereafter no pulses appearing on bus 12' can enter the counter until such time in the next operating cycle as selector or selector 24' again enables a pulse-control device 14' to reset flip-flop 104. In contrast to FIG. 2, where the pulses entered into counter 20' are developed on bus 12' by the pulse-shift stages starting with stage 10a' and ending at the stage affected by selector or selector 24', in the circuit of FIG. 4 the pulses from bus 12' that start to enter the counter are the pulses provided by the first stage 10' whose device 14' responds to the selector or selector 24', counting of the pulses continuing thereafter until the final pulse is applied to bus 12' by stage 10z'.

An operation monitor like monitor 112 of FIG. 2 and devices for evidencing rate-of-rotation and direction-of-rotation of shaft 22' like gate 36 and unit 38 of FIG. 1 are implicitly included in each of the other embodiments.

In each of FIGS. 1-4, the value entering the counter is determined by the number of stages in the sequence of stages between a reference stage and the stage whose pulse-control device 14, 14' or 14" responds to the selector or actuator 24, 24' or 24". The reference stage is the initial stage 10a in FIG. 1 as well as in FIG. 2 and FIG. 3, while in FIG. 4 the reference stage is the final stage 10z.

It is evident that a wide range of modification may be made in the circuit apparatus of FIG. 104, and that varied application of such apparatus may be made by those skilled in the art. Therefore the invention should be construed broadly in accordance with its full spirit and scope.

What is claimed is:

1. A position encoder including a selector, a vast number of pulse-transfer stages interconnected in sequence and including a reference stage, each stage being adapted to respond to a pulse and to provide a pulse to the next stage in the sequence, said stages having respective control devices distributed physically in an array corresponding to the positions to be encoded, said selector and said array of control devices being movable relative to each other for cooperation of said selector with said control devices in the same sequence as the sequence of interconnection of their respective stages, and said selector being disposed in cooperation with at least one of said control devices at all times during the relative movement of said selector along said array of control devices, an encoding counter, means for delivering a train of pulses to the counter in time with the transfer of pulses by said stages, and means controlled by the cooperation of the selector with one or more of said control devices for causing the counter to count the number of delivered pulses occurring between the operations of said reference stage and a stage related to one of said control devices at which the selector is disposed, said counter having combination-code output means for providing encoded output representing the relative positioning of said selector and said array of control devices.

2. An encoder in accordance with claim 1, wherein said sequence of pulse-transfer stages including said control device comprise an integrated circuit.

3. An encoder in accordance with claim 2 wherein said control devices are solid-state photosensitive elements and said selector is a light source.

4. An encoder in accordance with claim 15, wherein said pulse transfer stages are coupled to a bus forming part of said pulse train providing means.

5. A rotational encoder in accordance with claim 1, wherein said control devices of said sequence of stages are distributed about a circle, and wherein the selector and the circle of control devices are relatively movable angularly about the center of the circle, for enabling the counter to provide encoded representations of the relative angular position of the control devices and the said selector.

6. An encoder in accordance with claim 5, further including means for comparing the values represented in the counter at discrete time intervals for representing the speed of the relative angular motion of the selector and the array of control elements.

7. An encoder in accordance with claim 5, further including means for comparing the values represented in the counter in succeeding operations thereof for evidencing the direction of angular motion of the selector and the array of control elements.

8. A rotational position encoder in accordance with claim 5, wherein said reference stage is the initial stage of said sequence and wherein the counter is arranged to count pulses corresponding to the transfer of pulses by those stages between the initial stage of the sequence and the first stage in the sequence whose control device is disposed in cooperation with said selector.

9. An encoder in accordance with claim 5, wherein said reference stage is at the end of said sequence and wherein the counter is arranged to count pulses corresponding to the transfers of pulses by those stages between a stage whose control device is selected by said selector and said reference stage at the end of the sequence.

10. An encoder in accordance with claim 5, wherein said reference stage is the initial stage of said sequence, and wherein a said control device disposed in cooperation with said selector is effective to terminate pulse-transfer along the sequence of stages.

11. An encoder in accordance with claim 5, wherein said reference stage is the initial stage of the sequence, and wherein pulse-transfer along the sequence of stages is uninterrupted by cooperation of the selector with a said control device, further including means responsive to a said control device disposed in cooperation with said selector for halting response of the counter to pulses corresponding to subsequent ones of said sequence of stages.

12. An encoder in accordance with claim 11, wherein the sequence of pulse-transfer stages includes initial and final stages having respective pulse control means as aforesaid and interposed means for causing timed resetting of the counter and restarting of a pulse-transfer sequence of operation, said interposed means including at least one additional pulse transfer stage between said final stage and said initial stage.

13. An encoder in accordance with claim 12, including an alarm circuit coupled to said sequence of stages and rendered operative by interruption of the normally recurring pulses traversing said sequence of stages.

14. An encoder in accordance with claim 5, wherein said reference stage is the final one of said sequence of pulse-transfer stages, and wherein pulse-transmission along the sequence of stages is uninterrupted by the selector, further including means responsive to a said control device disposed in cooperation with said selector for starting response of the counter to the train of pulses.

15. An encoder in accordance with claim 5, wherein said pulse train providing means includes a clock pulse source for activating said pulse-transfer stages and causing them to become distinctively conditioned to respond to the respective control devices thereof in succession in time with pulses from the clock pulse source.

16. An encoder in accordance with claim 5, wherein each said stage is a monostable multivibrator having an "on" state and lapses into an "off" state a short time after being triggered "on" by a pulse from the preceding stage.

17. An encoder in accordance with claim 16, wherein said means for delivering a pulse train to said counter includes means for coupling signals to the counter from said successively triggered stages.

18. An encoder in accordance with claim 17, further including a source of cycle-timing signals, and wherein said selector and said source of cycle-timing signals are arranged to start and stop the triggering of said stages between said reference stage and a stage whose control device is disposed in cooperation with said selector, thereby determining the number of pulses counted by the counter for each cycle of operation.

19. An encoder in accordance with claim 1 wherein said selector and said array of elements are relatively rotatable and said array is circular.

20. An encoder in accordance with claim 19, further including a temporary storage device and means operated at periodic intervals to transfer the output of said counter to said storage device.

21. An enclocder in accordance with claim 20, further including means for taking the difference between a count in the storage device, and a subsequent count in the counter for representing the speed of relative rotation of the selector and the array of elements.

22. An encoder in accordance with claim 1, further including periodic means timed in relation to said pulse train delivering means for resetting the counter after each entry of a train of pulses.

23. A position including an array of a vast number of control elements arranged in accordance with a vast number of positions to be encoded and including a reference control element and a selector, said selector and said array being movable in relation to each other so that the selector moves relatively along said control elements for sequential cooperation therewith and so that said selector is disposed in cooperation with at least one control element at all times during its relative movement along the array, and means for providing combination codes in response to any such disposition for representing an individual one of said control elements in cooperation with said selector, said codes providing means including: electrical means for testing said control elements in prescribed succession as to cooperation thereof with said selector and for causing a train of pulses to be delivered, the pulses in the train being variable in number in dependence on the number of successively tested elements between said reference control element and one of said control elements disposed in selective cooperation with said selector, an encoding pulse counter coupled to said electrical means for counting the delivered train of pulses, said counter having a count capacity at least equal to the number of elements in said array and having combination-code output means for providing an encoded representation of the number of pulses in the train of pulses, and output coupling means from said combination-code output means for connection to combination-code utilization 24. An encoder in accordance with claim 23 wherein said control elements are solid-state photosensitive elements and said selector is a light source.

25. A position encoder including a selector and a plurality of interconnected electronic stages having an array of a vast number of control elements arranged in accordance with a vast number of positions to be encoded, said selector and said array of control elements being relatively movable so that the selector cooperates with the control elements sequentially and is in cooperation with at least one said control element at all times during its relative movement along the array, an encoding pulse counter having combination-code output means, means cyclically operable at intervals for testing said control elements along said array sequentially and operable synchronously for providing a train of pulses to said counter, said selector being effective to limit the number of pulses counted by the counter so that the counter provides an encoded representation of every position of the selector along said array, means for transferring the encoded output from the counter to code receiving means, and means for resetting the counter and for thereupon restarting the cyclically operable means.

26. A position encoder including a selector, an encoding pulse counter having a combination-code output means for providing an encoded representation of a number of input pulses, and means for providing sequential pulses to the counter including an array of a vast number of control elements arranged in accordance with a vast number of positions to be encoded, said control elements being individually and selectively responsive to said selector, said selector being relatively movable along said array of control elements for successive cooperation therewith and said selector being in cooperation with at least one of said control elements at all times during its relative movement along said array, and means operable at all positions of the selector along said array of responsive elements for controlling the number of pulses counted by said counter, whereby the counter provides an encoded representation of the relative position of the selector and said array, said encoder including means cyclically operable while the selector is located along said array of responsive elements for resetting the counter after each entry of a position-representing number of pulses and before the next such entry.

27. An encoder in accordance with claim 26, wherein said responsive elements are disposed in a circle and wherein said selector and said array are relatively rotatable about the center of the circle.

28. An encoder in accordance with claim 27, wherein said sequential pulse providing means includes a clock pulse generator and means controlled by said responsive elements for controlling the response of said counter to said sequential pulse providing m 29. An encoder in accordance with claim 27, wherein said sequential pulse providing means includes a sequence of pulse-producing stages controlled by said responsive elements for providing said pulses.

30. An encoder in accordance with claim 27 wherein said control elements are solid-state photosensitive elements and said selector is a light source.

31. A shaft position encoder including a circular array of a vast number of elements arranged in accordance with a vast number of shaft positions to be encoded and a selector, said array and said selector being rotatable in relation to each other to effect selective cooperation between said selector and each of said elements in succession, and said selector being disposed in cooperation with at least one of said elements at all times during its relative rotation along the array an encoding counter having combination-code output means and electrical circuit means controlled by any such disposition of said selector in relation to said array of elements for delivering a train of pulses to the counter, the number of pulses in the train being variable in dependence on one of the elements disposed in cooperation with said selector, and output coupling means for connecting combination-code utilization means to said combination-code output means.

32. Shaft speed indicating means including a circular array of elements arranged in accordance with a vast number of shaft positions to be encoded and a selector rotatable relative to each other, periodic means operable for counting the number of said elements between a particular element and an element selected by said selector while the selector and the element are in selected disposition, means for storing the count obtained in one operation of said periodic means, and means for comparing the count in said storing means with a subsequent count of said periodic means as a measure of rotary speed.

33. A speed-indicating shaft position encoder having a selector, and means controlled by said selector for providing a train of pulses, said pulse train providing means including a vast number of pulse-transfer stages, each stage being adapted to respond to a pulse and to provide a pulse to the next stage in the sequence, said stages including a reference stage and each of said stages having a respective control device, said devices being distributed about a circle and distributed in accordance with shaft positions to be encoded and variably related to said selector and responsive to said selector for delimiting the number of pulse-transfer operations that occur between the reference stage and a stage whose control device is selectively controlled by said selector, the selector and the circle of control devices being relatively movable angularly about the center of the circle, an encoding counter for counting said train of pulses and thereby providing an encoded representation of the relative angular position of said control devices and said selector, and means for comparing the values represented in the counter at discrete time intervals for representing the speed of relative angular motion of the control device and the selector.

* * * * *